(12) United States Patent
Pok et al.

(10) Patent No.: US 10,714,933 B2
(45) Date of Patent: Jul. 14, 2020

(54) METHOD AND APPARATUS FOR LOW CLAMPING VOLTAGE ESD SOLUTION FOR TRANSIENT SENSITIVE APPLICATIONS

(71) Applicant: Texas Instruments Incorporated, Dallas, TX (US)

(72) Inventors: Ponnarith Pok, Plano, TX (US); Timothy Don Davis, Arlington, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 286 days.

(21) Appl. No.: 15/194,186

(22) Filed: Jun. 27, 2016

(65) Prior Publication Data

US 2017/0373494 A1 Dec. 28, 2017

(51) Int. Cl.
*H02H 9/00* (2006.01)
*H02H 9/04* (2006.01)
*H01L 27/02* (2006.01)

(52) U.S. Cl.
CPC ......... *H02H 9/046* (2013.01); *H01L 27/0251* (2013.01)

(58) Field of Classification Search
CPC ...... H02H 9/046; H02H 11/0007; H02H 1/04; H01L 27/0266

USPC .......................................................... 361/56
See application file for complete search history.

(56) References Cited

U.S. PATENT DOCUMENTS

| | | | |
|---|---|---|---|
| 7,518,841 B2* | 4/2009 | Chuang | H01L 27/0285 361/56 |
| 7,672,103 B2* | 3/2010 | Moon | H01L 27/0285 361/111 |
| 8,829,618 B2 | 9/2014 | Pok et al. | |
| 2011/0266624 A1 | 11/2011 | Duvvury et al. | |
| 2014/0342515 A1 | 11/2014 | Pok et al. | |

* cited by examiner

*Primary Examiner* — Thienvu V Tran
*Assistant Examiner* — Lucy M Thomas
(74) *Attorney, Agent, or Firm* — Ray A. King; Charles A. Brill; Frank D. Cimino (57) ABSTRACT

An example apparatus includes: a signal terminal for inputting a signal or for outputting a signal; functional circuitry coupled to the signal terminal; a positive supply rail for supplying a positive voltage; a ground supply rail for supplying a ground voltage; a first electrostatic discharge protection circuit coupled between the positive supply rail and the ground supply rail; a second electrostatic discharge protection circuit coupled between the signal terminal and the ground supply rail; an enable circuit coupled to the signal terminal and to the positive supply rail; and a common trigger circuit having a trigger output signal coupled to the first electrostatic discharge protection circuit and to the second electrostatic discharge protection circuit. Additional apparatus and methods are disclosed.

15 Claims, 7 Drawing Sheets

METHOD AND APPARATUS FOR LOW CLAMPING VOLTAGE ESD SOLUTION FOR TRANSIENT SENSITIVE APPLICATIONS

TECHNICAL FIELD

This application relates in general to electronic circuitry, and in particular to low clamping voltage electro-static discharge (ESD) circuits.

BACKGROUND

Electrostatic discharge (ESD) is an ever present concern in the design, manufacture and handling of integrated circuits (ICs). An electrostatic voltage, which can be many thousands of volts, can appear on an input, output or power pin of a device. The static discharge occurs when the device is approached by a charged human or equipment. If the voltage from an ESD strike is passed into the integrated circuit device, permanent and destructive harm including gate oxide rupture of MOS transistors coupled to the pins can occur. The highest risk for ESD "strikes" is during handling and packaging operations when the die is exposed to potentially static charged machines or humans that come into contact with the device and the integrated circuit is not powered. Additional risk of ESD strikes can occur at other times when the integrated circuit is not powered.

Three common models used to describe the types of ESD events are the "human body model" (HBM), the "machine model" (MM) and the "charged device model" (CDM). In comparing the models, an ESD strike from the HBM has the longest duration of 100 nS, MM ESD strikes have comparatively faster rise times and more peak current, and CDM ESD strikes have the fastest rise time, less than 500 pS.

To prevent destructive harm from occurring due to ESD events during manufacturing, assembly, and handling of the IC, most integrated circuits have ESD protection circuits and structures formed around the conductors and near the fragile devices coupled to the input, output and power pins. These ESD structures provide low resistance paths that direct current from an input, output or power pin to a ground or positive power rail during an ESD event, and direct the current from the vulnerable internal circuitry.

Although ESD protection is essential when the integrated circuit device is unpowered, in conventional ESD protection structures the functional circuit design has to be arranged to avoid inadvertently triggering the ESD protection circuitry due to the normal switching operations of the circuit. If an ESD circuit is triggered inadvertently by normal transistor switching during circuit operation, the voltage clamping action of the ESD protection will cause erroneous operation of the integrated circuit. This requirement often puts undesirable limitations on the switching speed or slew rate of the primary function circuits. To avoid inadvertent triggering of the ESD protection, the speed and rise time for signals driven by the functional circuit have to be lowered and modified, degrading performance that the circuit could otherwise achieve.

Figure 1:
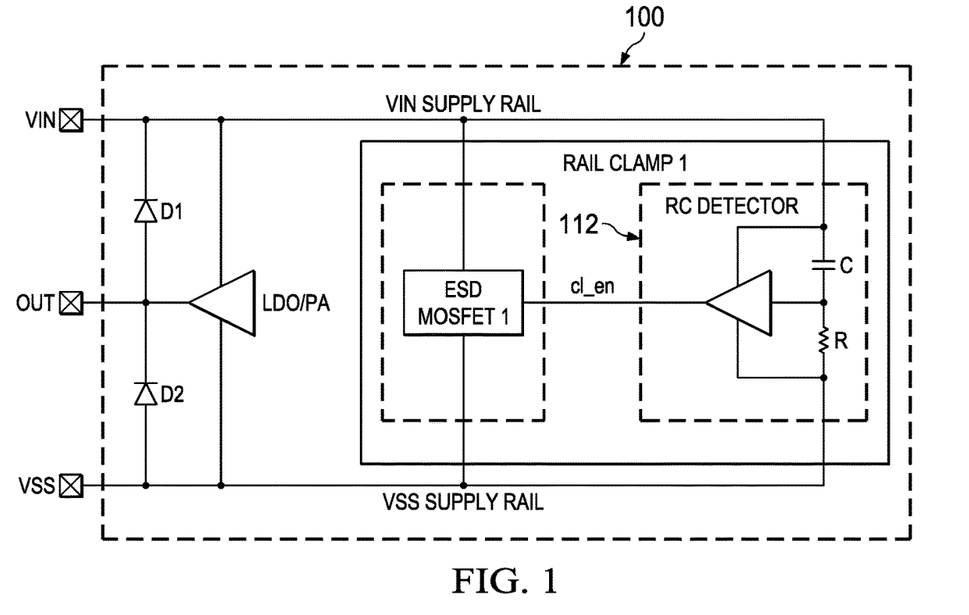
FIG. 1 depicts in a circuit diagram a conventional ESD protection circuit utilizing diodes with a single rail clamp.

FIG. 1 depicts a conventional solution for clamping ESD pulses using diodes in conjunction with a supply rail clamp. In the circuit 100, a low drop out regulator/power amplifier (LDO/PA) is biased with power supplies coupled to the pins or pads VIN and VSS. The ESD protection is effective for the device when it is a packaged integrated circuit and also when the circuit is within a bare die form, or as a die within a completed wafer that has not been prepared for packaging. Power rails VIN rail and VSS rail are coupled to the pins and carry the power supply voltages VIN, VSS into the device. The VIN and VSS supply rails are coupled to the external terminals for receiving a positive power supply voltage and a ground for negative supply voltage in operation. ESD protection is provided for the VIN and VSS rails by the circuit labeled "Rail Clamp 1." Rail Clamp 1 consists of a resistor-capacitor (RC) detector circuit 112 and a voltage clamp (which can be implemented by a MOSFET transistor, alternatively, other transistor types can be used). The voltage clamp ESD MOSFET 1 provides a low resistance path between the VIN supply rail and the VSS supply rails when it is enabled by the clamp enable signal (cl_en). When triggered by an increasing voltage between VIN and VSS that charges the capacitor C through resistor R, the detector circuit 112 produces a pulse on the signal clamp enable cl_en. The cl_en pulse duration depends on the values selected for the resistor R and capacitor C for a particular design, as these form a time constant proportional to the product R*C. In this conventional solution, the LDO/PA output pin OUT is protected from ESD events by diodes D1 and D2 and the rail clamp. A high positive or negative voltage at the output pin OUT will forward bias one of the diodes D1 or D2, and couple the pin OUT to either the VIN supply rail (positive ESD voltage) or the VSS supply rail (negative ESD voltage), triggering the rail clamp and thus protecting the LDO/PA or other circuitry coupled to the pin OUT from damaging current during an ESD strike.

When no power is applied to the device 100, a negative ESD pulse at the pin OUT with respect to VSS will be shunted by the diode D2 to the VSS supply rail, because D2 becomes forward biased. A positive ESD pulse propagating between the VIN and VSS inputs will cause the RC Detector 112 to trigger, thus sending an enable pulse on the cl_en line. The pulse on the cl_en line activates the ESD MOSFET 1 that then clamps the VIN supply rail to VSS, safely shunting the ESD current. The clamping action protects the transistors within the LDO/PA that are coupled to the VIN or VSS supply rail from ESD damage by limiting the voltage across these rails. When a positive ESD pulse with respect to VSS occurs on the OUT line, the voltage on OUT will increase, forward biasing diode D1, coupling the rising ESD voltage to the VIN supply rail, and eventually triggering Rail Clamp 1. Note that the OUT line will experience a higher clamped voltage than that occurring directly across Rail Clamp 1 due to the additional voltage drop across diode D1 and the rail bus metal resistance. The higher voltage experienced by OUT carries an additional risk of damage to the circuitry connected to the OUT line. Note that when the circuit 100 is powered, the ESD protection circuitry in Rail Clamp 1 is still active. A rapid voltage rise on the power pin VIN can inadvertently trigger the RC detector 112. During power up operations, care must be taken to ensure this does not occur.

Figure 2:
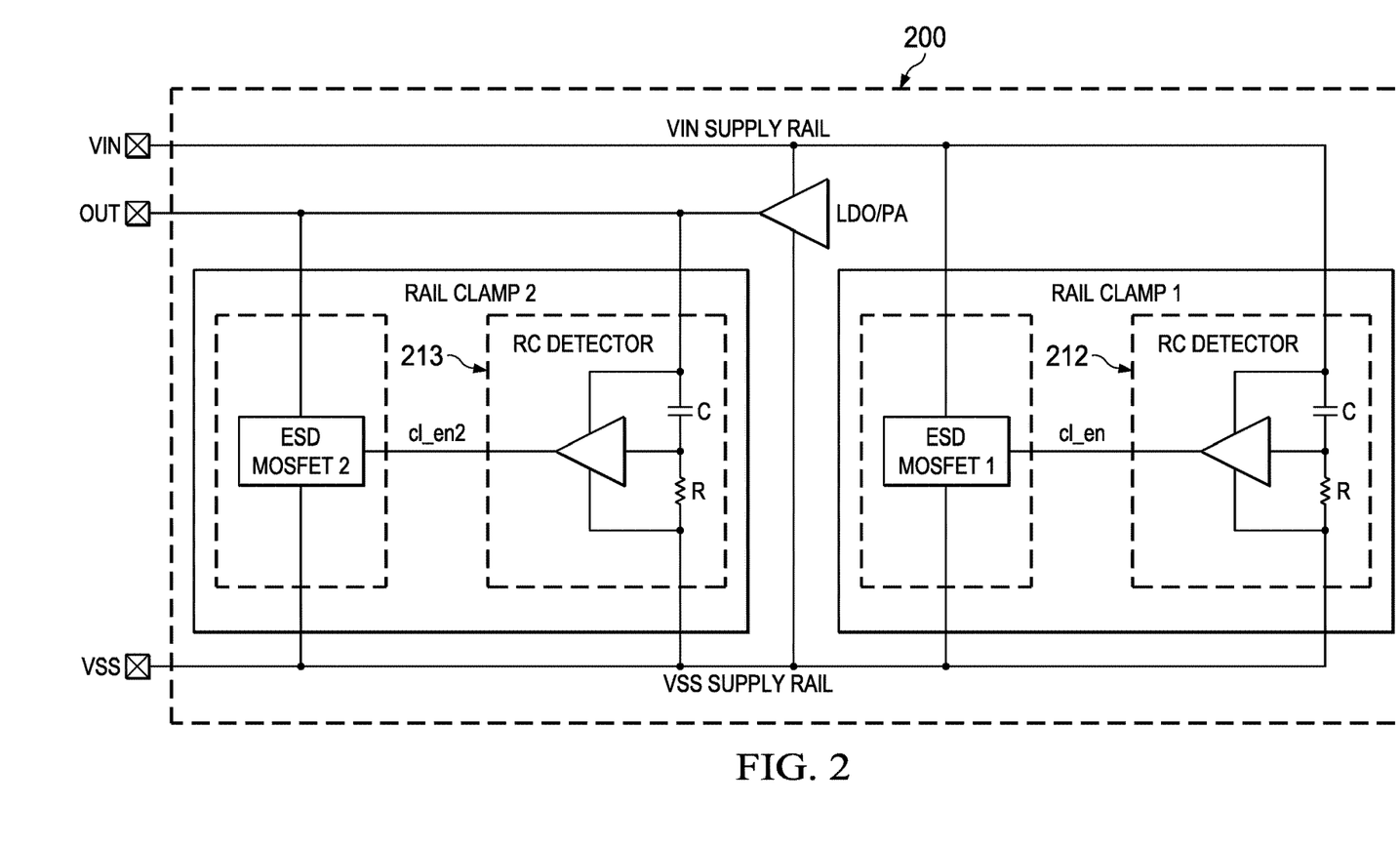
FIG. 2 depicts in a circuit diagram a conventional low clamping voltage ESD protection solution utilizing dual rail clamps.

FIG. 2 depicts a conventional low clamping voltage ESD protection solution utilizing dual rail clamps, labeled Rail Clamp 1 and Rail Clamp 2. In the device 200, which can be an integrated circuit or a bare die, a low drop out regulator/power amplifier (LDO/PA) is biased with power supplied to the VIN supply rail and the VSS supply rail at pins VIN and VSS. ESD protection is provided for the VIN and VSS supply rails by Rail Clamp 1. As in FIG. 1, Rail Clamp 1 consists of a detector circuit 212 paired with a voltage clamp (ESD MOSFET 1, which can be implemented using a MOSFET as indicated in the figure, alternatively other transistor device types such as bipolar transistors can be used as the voltage clamp). When the detector circuit 212 is triggered, the detector circuit produces a pulse on the clamp enable (cl_en) line which activates ESD MOSFET 1. The duration of the enable pulse is determined by the values selected for the resistor R and capacitor C. The voltage clamping circuit ESD MOSFET 1 couples the VIN supply rail to the VSS supply rail, preventing damaging current from harming the components within LDO/PA, such as MOS transistors that are coupled to the VIN supply rail.

When no supply power is applied to the circuit 200, the VIN supply rail and VSS supply rail are protected from a positive ESD pulse by Rail Clamp 1, which operates as described hereinabove with respect to FIG. 1. When a positive ESD pulse with respect to VSS occurs on the OUT line, the fast rising ESD pulse triggers the detector circuit 213 of Rail Clamp 2. The detector circuit 213 then transmits a pulse on the clamp enable signal cl_en2 to voltage clamp ESD MOSFET 2. Voltage clamp ESD MOSFET 2 clamps the pin OUT to the VSS supply rail. The clamped voltage can be near 1 volt. This clamped ESD voltage is a reduced maximum clamping voltage and thus improved ESD protection at the pin or pad OUT (when compared to the maximum clamping voltage using the FIG. 1 arrangement described hereinabove). The improved ESD protection is because the clamping action does not need to occur through a diode and VIN/VSS rail bus resistance. The improved ESD protection comes at the cost of functional performance for signals connected to OUT. More importantly, the operations of the functional circuitry such as the LDO/PA circuit also have to be modified to avoid inadvertent ESD triggers. The ESD protection remains active when the device is powered and operating. A fast rising voltage at the output pin OUT can trigger the RC detector 213, and the design performance for the amplifier LDO/PA has to be degraded using slew rate control or other measures to ensure this does not occur. Performance of the LDO/PA circuit is therefore degraded.

Figure 3A:
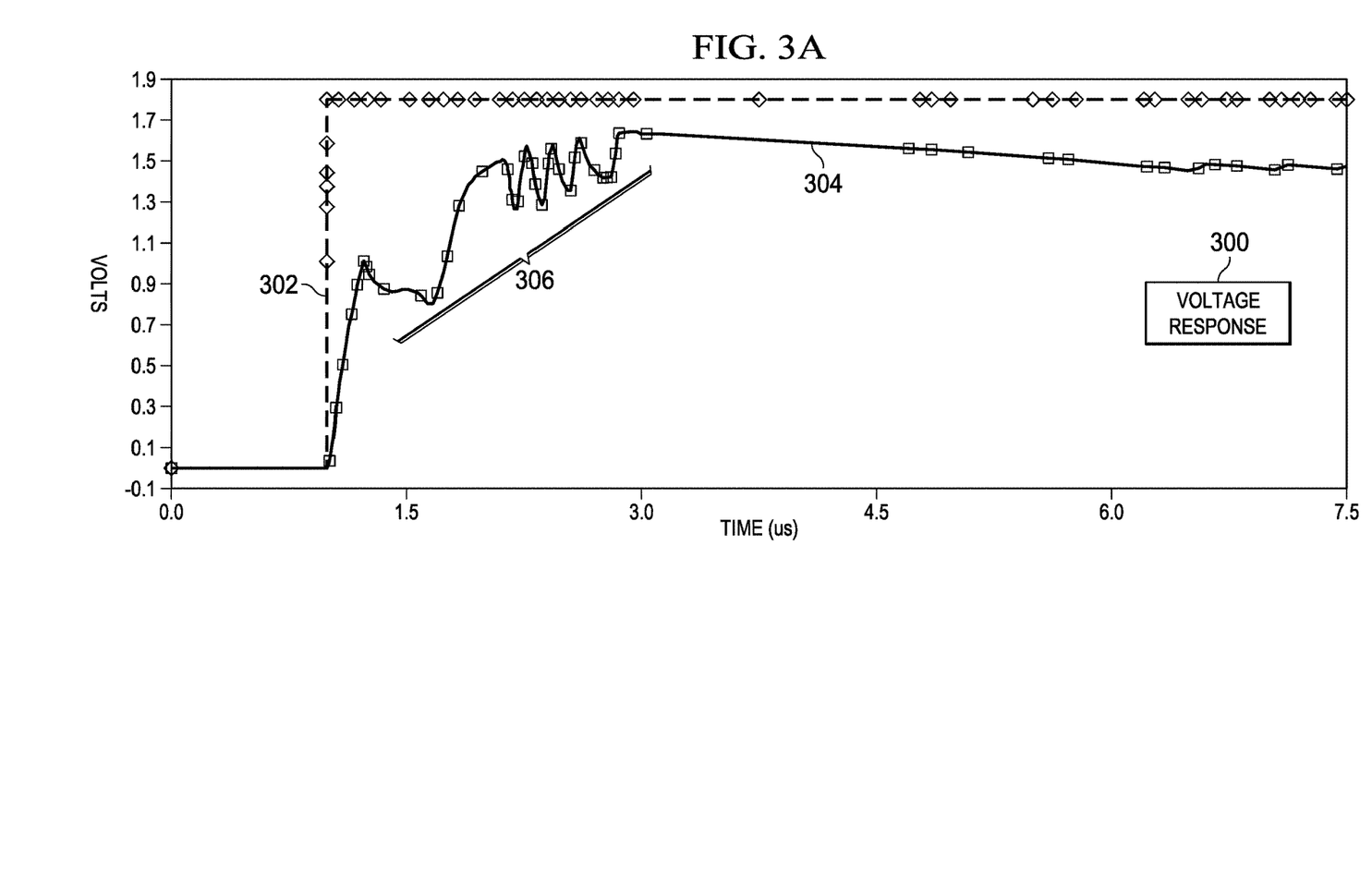
FIGS. 3A and 3B illustrate in graphs a simulated voltage and a simulated current response of the low clamping voltage ESD protection solution of FIG. 2.
Figure 3B:
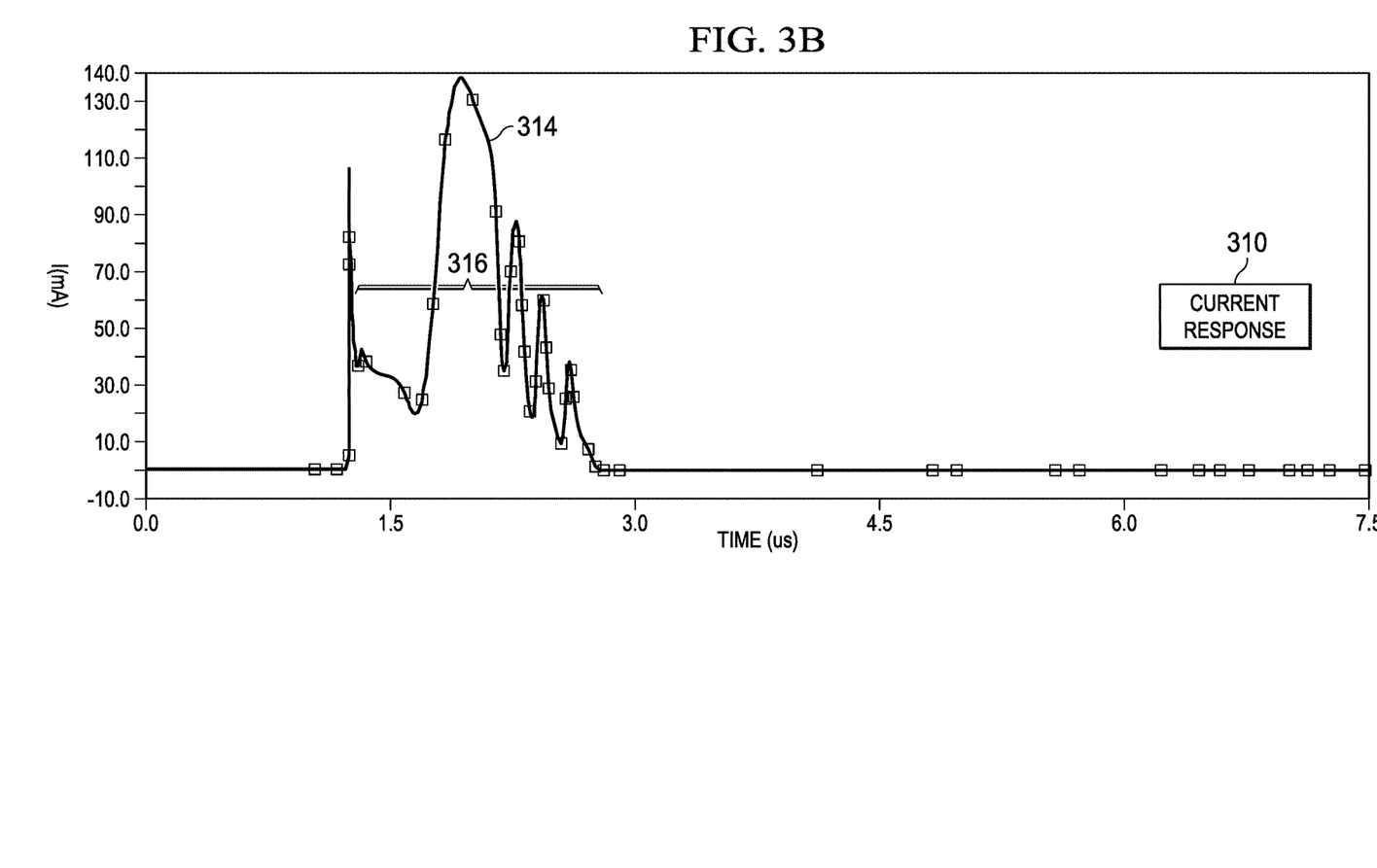

FIGS. 3A and 3B depict a simulated voltage response and a simulated current response of the low clamping voltage ESD solution of FIG. 2, and the graphs illustrate its limitations during functional operation. The vertical axis in graph 300 of FIG. 3A is in volts, with magnitude increasing from the origin. The vertical axis in graph 310 of FIG. 3B is current in milliamps with magnitude increasing from the origin. The horizontal axis of both FIGS. 3A and 3B is time in microseconds (uS) for graphs 300 and 310, with increasing time moving from the origin to the right.

In FIG. 3A, voltage waveform 302 is a simulated input enable signal to the LDO/PA. Waveform 304 is the simulated voltage at terminal OUT from the LDO/PA in response to the input waveform 302. Waveform 314 is the current flowing in the voltage clamp ESD MOSFET 2 within Rail Clamp 2 of FIG. 2 in response to the LDO/PA output waveform 304.

With power applied to the circuit 200 and enabled by the enable signal of waveform 302, the desired functional LDO/PA output of waveform 304 should reflect a simple voltage ramp from 0V to 1.5V. Instead of the desired voltage step, voltage waveform 304 shows the voltage clamping action of the ESD MOSFET in region 306. Waveform 314 shows current flowing through the ESD MOSFET 2 in region 316. Current flowing in the region 316 indicates that the fast rising voltage output 304 causes ESD detection circuit 213 to trigger. Thus, the circuit which provides desirable protection in an ESD event may introduce undesirable effects in normal operation. FIGS. 3A and 3B illustrate the undesirable effects of inadvertent triggering of the low clamping voltage ESD protection circuit Rail Clamp 2 during operation of the circuit 200.

SUMMARY

In described examples, an apparatus includes a signal terminal for inputting a signal or for outputting a signal; functional circuitry coupled to the signal terminal; a positive supply rail for supplying a positive voltage; a ground supply rail for supplying a ground voltage; a first electrostatic discharge protection circuit coupled between the positive supply rail and the ground supply rail; a second electrostatic discharge protection circuit coupled between the signal terminal and the ground supply rail; an enable circuit coupled to the terminal and to the positive supply rail; and a common trigger circuit having a trigger output signal coupled to the first electrostatic discharge protection circuit and to the second electrostatic discharge protection circuit.

DETAILED DESCRIPTION OF THE EXAMPLE EMBODIMENTS

Corresponding numerals and symbols in the different figures generally refer to corresponding parts unless otherwise indicated. The figures are drawn to clearly illustrate the relevant aspects of the illustrative example arrangements and are not necessarily drawn to scale.

When the term "coupled" is used herein to describe relationships between elements, it is not limited to "connected" or "directly connected." Accordingly, the term "coupled" may include connections made through intervening elements, so additional connections may exist between any elements that are "coupled."

Example embodiments provide low clamping voltage ESD solutions that overcome deficiencies in conventional solutions, and that allow for adjustable low clamping voltages and that enable multiple ESD clamping circuits with a single trigger circuit.

Figure 4:
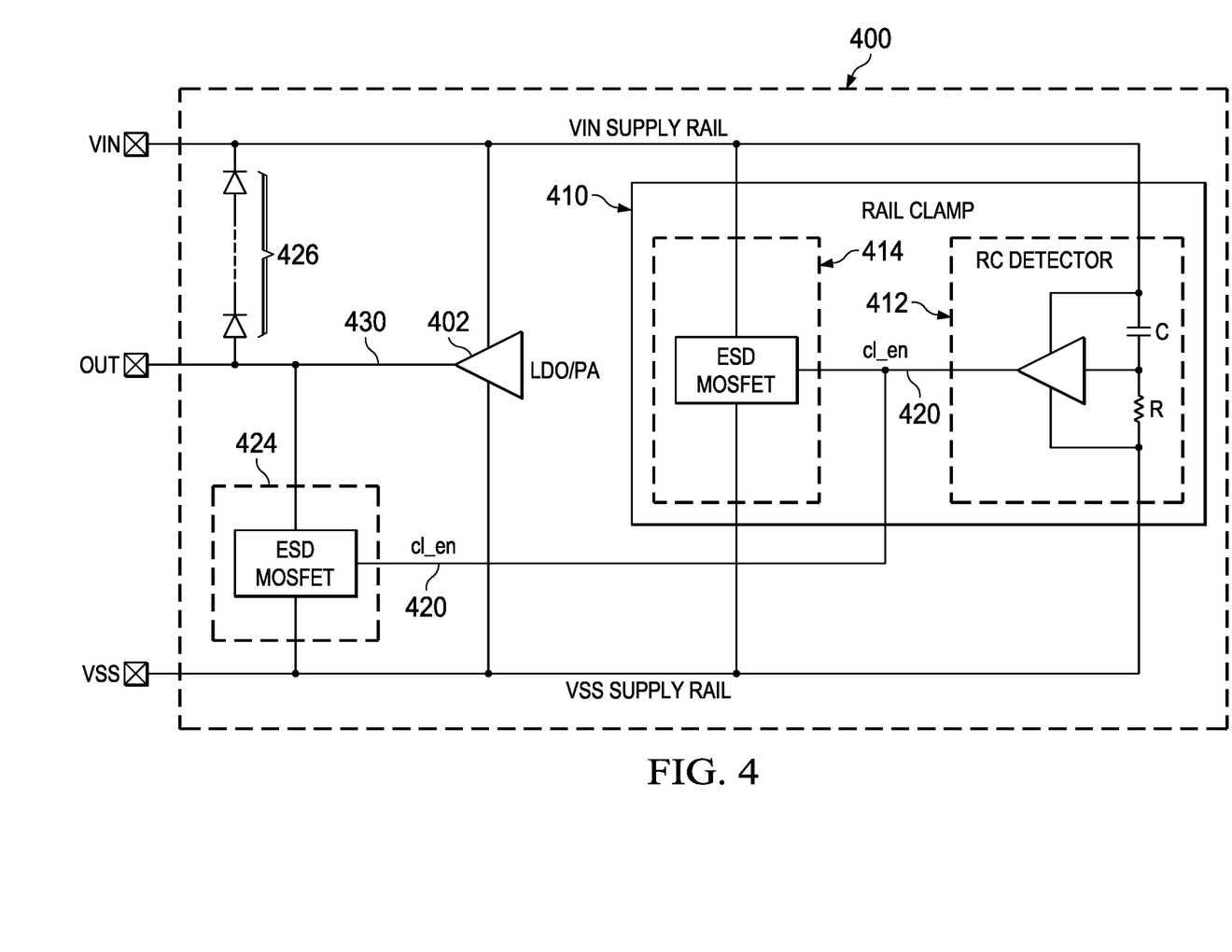
FIG. 4 illustrates in a block diagram an example embodiment for a low clamping voltage ESD protection circuit.

FIG. 4 is a circuit diagram of a low clamping voltage ESD embodiment. In an example, circuit 400 is at least a portion of an integrated circuit. A low drop out regulator/power amplifier (LDO/PA) 402 is supplied by the power rails VIN supply rail and VSS supply rail. Each of the power rails is coupled to a respective terminal for receiving the power (VIN) and ground (VSS) voltages. The terminals VIN and VSS can be pins of a packaged integrated circuit; or can be bond pads of a bare die device or a die within a wafer that has not yet been packaged. ESD protection is provided for ESD strikes between the VIN and VSS terminals by Rail Clamp 410. Rail Clamp 410 includes a series resistor capacitor (RC) detector circuit 412 coupled to a first voltage clamp 414. The LDO/PA output 430 is coupled to an output (OUT) pin. The output pin OUT is protected from ESD strikes by one or more diodes 426 in series and by a second voltage clamp 424. Both voltage clamp 424 and voltage clamp 414 are activated by the common trigger circuit 412 via a clamp enable (cl_en) signal 420.

The series of diodes 426 is arranged so that the voltage needed to forward bias the diode string 426 is greater than the peak voltage of the LDO/PA output while in normal operation. The maximum output voltage from the LDO/PA circuit in operation is limited by the supply voltage VIN and some margin for overshoot. Diode string 426 acts as an ESD trigger enable circuit. When the circuit 400 is unpowered a positive voltage at the signal terminal OUT with respect to VSS forward biases the diode string 426 and couples the rising ESD voltage at the signal terminal OUT to the VIN supply rail. The custom arrangement of diodes 426 enables adjustable voltage threshold detection. When the positive operational supply voltage is driven at terminal VIN and on the positive supply rail, the highest voltage the output of the LDO/PA circuit can produce is equal to the positive supply voltage plus some margin, thus the diode string acts as a "disable" for ESD-related circuitry 410, 420, and 424 when the circuit 400 is in normal operation. The voltages produced at the output pin OUT will not be coupled to the positive VIN supply rail, because the diode string 426 will not be forward biased. The enable and disable aspects of the embodiments enable ESD protection for a variety of different circuits that have different peak output voltages, and enable designs where the ESD trigger circuit will not be inadvertently activated by a fast switching voltage at the output pin OUT in normal operation.

With no power applied to the device, a negative ESD pulse with respect to VSS at the output pin OUT is shunted by the inherent body diode of the ESD MOSFET 424 (not shown). In an alternative arrangement that forms an additional embodiment, an explicit substrate diode can also be placed in parallel to the body diode of the ESD MOSFET. A positive ESD pulse at the output pin OUT with respect to VIN will be shunted by the series diodes 426. A positive ESD pulse propagating between the VIN and VSS lines will cause the RC Detector 412 to trigger, sending a pulse on the cl_en line 420. In some example embodiments, the cl_en pulse duration is in a time range between about 500 nS to 10 uS. The duration of the enable pulse on cl_en is determined by the selection of the values for the resistor R and capacitor C. The pulse on the cl_en line 420 activates both ESD voltage clamps 414 and 424. Voltage clamp 414 shunts the VIN supply rail to the VSS supply rail, limiting the ESD-induced Pulse between VIN and VSS to near 1 volt. The same cl_en pulse activates voltage clamp 424 that shunts the output pin OUT to the VSS supply rail. The activation of voltage clamps 414 and 424 by detector 412 protects the circuitry within the LDO/PA 402 from ESD damage.

While still unpowered, a positive ESD pulse occurring on the OUT line results in the voltage on OUT increasing, forward biasing diode string 426, coupling the rising ESD voltage to the VIN supply rail and eventually triggering the RC Detector 412. The detector 412 again sends a pulse on the cl_en line 420 that activates the voltage clamps 414 and 424. Voltage clamp 424 shunts the pin OUT to the VSS supply rail, limiting the ESD-induced Pulse between OUT and VSS to near 1 volt. The same cl_en pulse activates voltage clamp 414 that shunts the VIN supply rail to the VSS supply rail. The activation of voltage clamps 414 and 424 by detector 412 protect the circuitry within LDO/PA 402 from ESD damage.

The embodiment illustrated in system 400 shows a single detector circuit 412 and a pair of ESD voltage clamps 414 and 424 providing ESD protection for a single LDO/PA. Another example embodiment can activate more than two ESD clamps by the single detector 412 allowing additional circuits to be ESD protected. Because the ESD protection for the additional circuits do not require and additional detector 412, the overall ESD protection circuitry count is reduced resulting in less power and less "real estate" consumed on the chip.

The example embodiment of FIG. 4 and the accompanying text hereinabove describe protection at an output pin or pad OUT. However, the ESD protection including the enable circuit of diode string 426, the use of a common trigger such as 412 and the use of at least two voltage clamping circuits to protect the terminal can be utilized for any input, output or input/output pin. The detector circuit 412 can be coupled to one, several or all of the voltage clamps to reduce area and components needed for ESD protection.

Figure 5A:
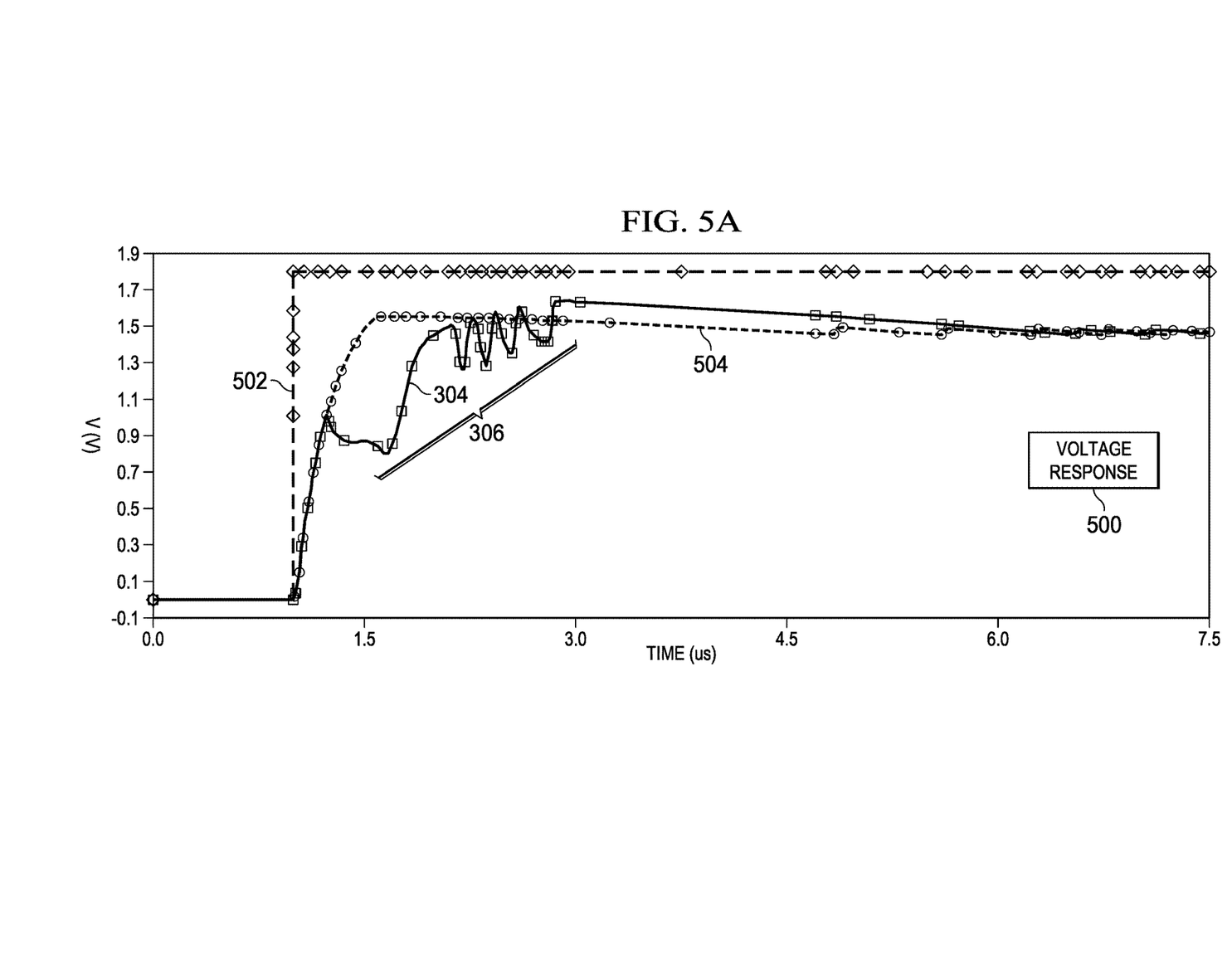
FIGS. 5A and 5B illustrate in graphs a comparison of the simulated voltage and current response of the low clamping voltage ESD solutions of FIG. 2 and FIG. 4.
Figure 5B:
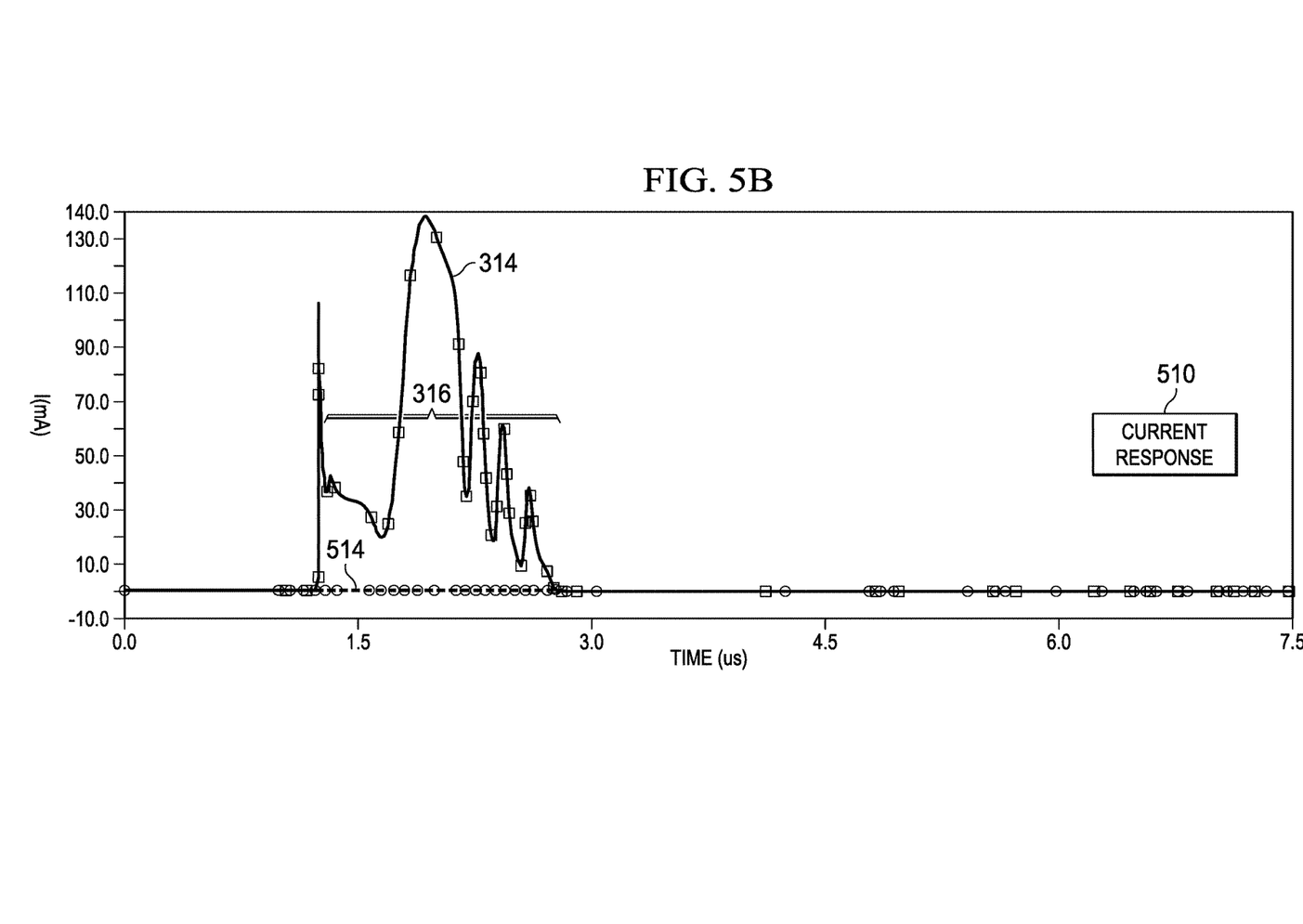

FIGS. 5A and 5B illustrate in several graphs a comparison of the simulated voltage and current response of the low clamping voltage ESD solutions of FIG. 2 and the results for the embodiment circuit 400 in FIG. 4. The vertical axis in graph 500 is in volts, with magnitude increasing from the origin. The vertical axis in graph 510 is current in milliamps with magnitude increasing from the origin. The horizontal axis is time in microseconds (uS) for both graphs 500 and 510 with increasing time moving from the origin to the right. Waveform 502 is a simulated input enable signal to the LDO/PA 402 in FIG. 4, and it is identical to the waveform 302 from graph 310 of FIG. 3A. Waveform 504 is the voltage response of the LDO/PA output (430 in FIG. 4, or the voltage on the terminal OUT) to waveform 502. Waveform 304 in FIG. 5A is a copy of the waveform 304 from graph 300 of FIG. 3A, presented in FIG. 5A for comparison. Waveform 514 is the simulated current flowing thru ESD MOSFET 424 in response to the voltage waveform 504 at the terminal OUT. Waveform 314 is a copy of the waveform 314 from graph 310 of FIG. 3B, presented in FIG. 5B for comparison.

With power applied to the circuit 400 and enabled by the waveform of 502 so that it is in a normal operating mode, the LDO/PA output waveform 504 approximates a voltage ramp from 0V to 1.5V, as desired. In region 316, waveform 514 in FIG. 5B indicates that no current flows through the ESD MOSFET 424, indicating that waveform 504 at the output of the LDO/PA did not trigger the ESD detector 412. In comparison, the current flowing in the region 316 in waveform 314 illustrates the current flow of the conventional ESD low clamping voltage solution shown in FIG. 2. The voltage waveform 504 in region 306 indicates the output voltage response of the LDO/PA is without any effects of the voltage clamping circuit ESD MOSFET 424, since ESD MOSFET 424 is not activated. Thus, the embodiment of FIG. 4 provides the ESD protection similar to of the circuit of FIG. 2 but without the possibility of inadvertent triggering of the ESD circuitry. The simulation presented in FIGS. 5A and 5B therefore shows that the embodiment of FIG. 4 has eliminated sensitivity of the ESD circuitry to the switching frequency of the LDO/PA output (as opposed to the sensitivity observed in the circuit of FIG. 2) while the circuit is powered and operating normally.

The voltage clamping circuits described in the examples presented hereinabove are described as implemented using MOSFET transistors to clamp the OUT pin or VIN supply rail to VSS (or vice versa). In alternative embodiments, other clamping circuits can be used. For example, bipolar transistors can be used to couple the clamped signal to the VSS or VIN supply rail. In the example embodiments described hereinabove, the detector circuits used to trigger the ESD voltage clamps are shown using an RC pulse circuit. In alternative embodiments, other circuitry arranged to detect an ESD event can be used to trigger the ESD clamping circuits.

Figure 6:
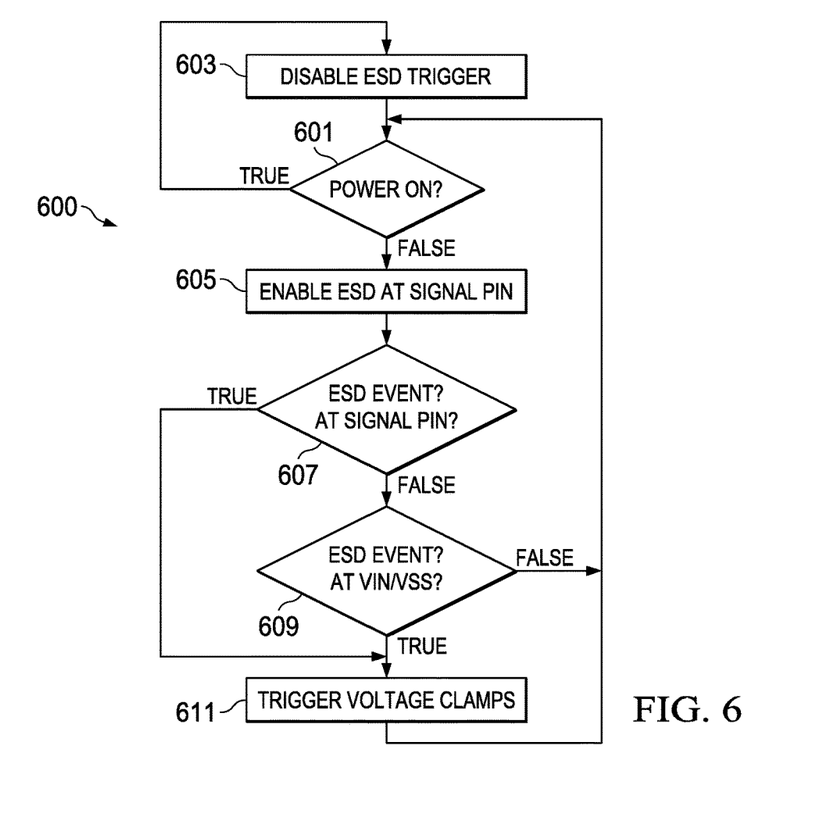
FIG. 6 illustrates in a flow diagram a method embodiment.

FIG. 6 depicts in a flow diagram a method embodiment 600. In FIG. 6, the method begins at step 601. If the power to the device is on, that is, a positive power supply is coupled to the supply terminal VIN, the method transitions to step 603. At step 603, the ESD trigger is disabled. In the embodiments described hereinabove, the operation of the diode string 426 performs the disable function by being reverse biased with respect to the voltage at the signal terminal OUT.

In FIG. 6, if the query at step 601 is false, the method transitions to step 605, where the ESD protection is enabled. In the example embodiments described hereinabove, the diode string 426 provides this enable function by being forward biased with respect to the positive power supply rail VIN when the circuit is unpowered.

The method 600 then transitions to step 607. If a positive ESD event with respect to VSS occurs at the signal pin, the series diode string 426 will couple the increasing ESD voltage to the VIN supply rail. The method then transitions to step 611 and the rising voltage now on the VIN power supply rail will cause the common ESD detector circuit to trigger the voltage claims.

If the decision at step 607 is false, then the method transitions to step 609, where the circuit can detect an ESD event at the power terminals VIN or VSS. If an event occurs, the method transitions to step 611. If there is no ESD event the method transitions to step 601 and the method begins again.

At step 611, the voltage clamps are triggered, and the method then transitions to step 601 and begins again. The method is performed continuously so that ESD protection is always provided.

While the steps shown in FIG. 6 imply one possible order of steps, the steps can be performed in different order to form additional embodiments. For example, steps 607 and 609 are performed simultaneously, and there is not a particular sequence.

In an example embodiment, an apparatus includes a signal terminal for inputting a signal or for outputting a signal; functional circuitry coupled to the signal terminal; a positive supply rail for supplying a positive voltage; a ground supply rail for supplying a ground voltage; a first electrostatic discharge protection circuit coupled between the positive supply rail and the ground supply rail; a second electrostatic discharge protection circuit coupled between the terminal and the ground supply rail; an enable circuit coupled to the terminal and to the positive supply rail; and a common trigger circuit having a trigger output signal coupled to the first electrostatic discharge protection circuit and to the second electrostatic discharge protection circuit.

In another example, the first electrostatic discharge protection circuit further includes a first voltage clamping circuit coupled between the positive supply rail to the ground rail. In yet another example the second electrostatic discharge protection circuit further comprises a second voltage clamping circuit coupled between the signal terminal and the ground rail. In an additional example, the first voltage clamping circuit and the second clamping circuit further include a transistor clamping circuit. In still another example, the enable circuit includes at least one diode coupled between the signal terminal and the positive supply rail.

In a further example, the common trigger circuit is coupled between the positive supply rail and the ground supply rail. In still another example, the common trigger circuit includes a resistor and capacitor series coupled between the positive supply rail and the ground supply rail. In an alternative example, the enable circuit is configured to couple the signal terminal to the positive supply rail when the positive supply rail is unpowered. In still a further example, the enable circuit is configured to not couple the signal terminal to the positive supply rail when the positive supply rail has a positive operating voltage thereon. In yet another example the trigger circuit does not respond to voltages at the signal terminal when the positive supply rail has a positive operating voltage thereon. In still a further example, the enable circuit includes at least two series coupled diodes between the signal terminal and the positive supply rail. In a further example, the functional circuitry coupled to the signal terminal includes a power amplifier coupled to drive an output voltage at the signal terminal.

A method embodiment includes: in an unpowered mode of operation of a circuit, coupling a voltage from an electrostatic discharge at a signal terminal of the circuit to a positive supply rail within the circuit; in the unpowered mode of operation, operating a common trigger circuit to enable at least a first voltage clamping circuit to perform electrostatic discharge protection, responsive to the changing voltage at the positive supply rail; and in a normal mode of operation of the circuit, disabling the common trigger circuit from triggering in response to changing voltages at the signal terminal.

In another example, in the method the normal mode of operation corresponds to a functional mode of operation of devices within the circuit that are coupled to the signal terminal. In still another example, performing electrostatic discharge protection responsive to the rising voltage at the signal terminal includes clamping the positive supply rail to a ground rail within the circuit using a first ESD clamping circuit and clamping the signal terminal to the ground rail using a second ESD clamping circuit, both the first and second ESD clamping circuits are triggered by the common trigger circuit. In a further example method, disabling the common trigger circuit further includes positioning at least one diode between the signal terminal and the positive supply rail when a positive supply voltage is on the positive supply rail. In still another example, the unpowered mode of operation corresponds to an operation when there is no positive supply voltage on the positive supply rail of the circuit.

In yet another example embodiment, an integrated circuit includes a positive supply terminal for receiving a positive supply voltage during an enable mode of operation; a ground supply terminal for receiving a ground voltage; a signal terminal coupled to an internal circuit; a first voltage clamp coupled between a positive supply rail coupled to the positive supply terminal and a ground rail coupled to the ground terminal; a second voltage clamp coupled between the signal terminal and the ground rail; an enable circuit coupled between the signal terminal and the positive supply rail; and a common trigger circuit coupled between the positive supply rail and the ground rail and having a trigger signal output coupled to both the first and second voltage clamps.

In a further example, the enable circuit includes at least one diode coupled between the signal terminal and the positive supply rail. In still another example, the enable circuit includes a chain of series coupled diodes coupled between the signal terminal and the positive supply rail.

Modifications are possible in the described embodiments, and other embodiments are possible within the scope of the claims.

What is claimed is:

1. Apparatus, comprising:
   a signal terminal for inputting a signal or for outputting a signal;
   functional circuitry coupled to the signal terminal;
   a positive supply rail for supplying a positive voltage;
   a ground supply rail for supplying a ground voltage;
   a first electrostatic discharge protection circuit coupled between the positive supply rail and the ground supply rail;
   a second electrostatic discharge protection circuit coupled between the signal terminal and the ground supply rail;
   an enable circuit comprised of a string of one or more diodes arranged in series so that an anode of a first diode in the diode string is directly coupled to the signal terminal and a cathode of a last diode in the diode string is directly coupled to the positive supply rail, and is arranged so that the voltage needed to forward bias the diode string is greater than the peak voltage at the signal terminal; and
   a common trigger circuit that includes a series combination of a resistor and a capacitor connected directly to both the positive supply rail and the ground supply rail, wherein the series combination of the resistor and the capacitor is coupled to the cathode of the last diode in the diode string, the common trigger circuit having a trigger output signal coupled to the first electrostatic discharge protection circuit and to the second electrostatic discharge protection circuit.

2. The apparatus of claim 1, wherein the first electrostatic discharge protection circuit further includes a first voltage clamping circuit coupled between the positive supply rail and the ground rail.

3. The apparatus of claim 2, wherein the second electrostatic discharge protection circuit further comprises a second voltage clamping circuit coupled between the signal terminal and the ground rail.

4. The apparatus of claim 3, wherein the first voltage clamping circuit and the second clamping circuit further include a transistor clamping circuit.

5. The apparatus of claim 1, wherein the enable circuit includes at least two diodes coupled between the signal terminal and the positive supply rail.

6. The apparatus of claim 1, wherein the enable circuit is configured to couple the signal terminal to the positive supply rail when the positive supply rail is unpowered.

7. The apparatus of claim 1, wherein the enable circuit is configured to not couple the signal terminal to the positive supply rail when the positive supply rail has a positive operating voltage thereon.

8. The apparatus of claim 7, wherein the trigger circuit does not respond to voltages at the signal terminal when the positive supply rail has a positive operating voltage thereon.

9. The apparatus of claim 1, wherein the functional circuitry coupled to the signal terminal includes a power amplifier coupled to drive an output voltage at the terminal.

10. A method, comprising:
    in an unpowered mode of operation of a circuit, coupling a voltage from an electrostatic discharge at a signal terminal of the circuit to a positive supply rail within the circuit;
    in the unpowered mode of operation, operating a common trigger circuit that includes a common trigger resistor and a common trigger capacitor in series coupled between the positive supply rail and the ground supply rail to enable at least a first voltage clamping circuit to perform electrostatic discharge protection, responsive to the changing voltage at the positive supply rail;
    in a normal mode of operation of the circuit, disabling the common trigger circuit from triggering in response to changing voltages at the signal terminal;
    wherein disabling the common trigger circuit further includes reverse biasing a string of one or more diodes arranged in series so that an anode of a first diode in the diode string is directly coupled to the signal terminal and a cathode of a last diode in the diode string is directly coupled to the positive supply rail and to the common trigger resistor and common trigger capacitor in series, and the diode string is arranged so that the voltage needed to forward bias the diode string is greater than the peak voltage at the signal terminal.

11. The method of claim 10, wherein the normal mode of operation corresponds to a functional mode of operation of devices within the circuit that are coupled to the signal terminal.

12. The method of claim 10, wherein performing electrostatic discharge protection responsive to the changing voltage at the signal terminal includes clamping the positive supply rail to a ground rail within the circuit using a first ESD clamping circuit and clamping the signal terminal to the ground rail using a second ESD clamping circuit, both the first and second ESD clamping circuits are triggered by the common trigger circuit.

13. The method of claim 10, wherein the unpowered mode of operation corresponds to an operation when there is no positive supply voltage on the positive supply rail of the circuit.

14. An integrated circuit, comprising:
    a positive supply terminal for receiving a positive supply voltage during an enable mode of operation;
    a ground supply terminal for receiving a ground voltage;
    a signal terminal for inputting or outputting a signal, coupled to an internal circuit;
    a first voltage clamp coupled between a positive supply rail coupled to the positive supply terminal and a ground rail coupled to the ground terminal;
    a second voltage clamp coupled between the signal terminal and the ground rail;
    an enable circuit comprised of a string of one or more diodes arranged in series so that an anode of a first diode in the diode string is directly coupled to the signal terminal and a cathode of a last diode in the diode string is directly coupled to the positive supply rail, and is arranged so that the voltage needed to forward bias the diode string is greater than the peak voltage at the signal terminal; and
    a common trigger circuit that includes a series combination of a resistor and a capacitor connected directly to both the positive supply rail and the ground rail, wherein the series combination of the resistor and the capacitor is coupled to the cathode of the last diode in the diode string, the common trigger circuit having a trigger signal output coupled to both the first and second voltage clamps.

15. The integrated circuit of claim 14, wherein the enable circuit includes at least two diodes coupled between the signal terminal and the positive supply rail.

* * * * *